United States Patent [19]

Kawashima

[11] Patent Number: 5,414,515
[45] Date of Patent: May 9, 1995

[54] SURFACE POSITION DETECTING DEVICE

[75] Inventor: Haruna Kawashima, Kawasaki, Japan

[73] Assignee: Canon Kabushiki Kaisha, Tokyo, Japan

[21] Appl. No.: 155,152

[22] Filed: Nov. 19, 1993

Related U.S. Application Data

[63] Continuation of Ser. No. 658,232, Feb. 20, 1991, abandoned.

[30] Foreign Application Priority Data

Feb. 23, 1990 [JP] Japan .................................. 2-44236

[51] Int. Cl.$^6$ ............................................. G01B 11/30
[52] U.S. Cl. ..................................... 356/371; 356/400
[58] Field of Search .............................. 356/399–401, 356/371, 376; 355/43, 53; 250/561

[56] References Cited

U.S. PATENT DOCUMENTS

| | | | |
|---|---|---|---|
| 2,446,628 | 8/1948 | Brown | 356/371 |
| 4,395,117 | 7/1983 | Suzuki | 355/43 |
| 4,823,014 | 4/1989 | Miyawaki | 250/561 |
| 4,874,954 | 10/1989 | Takahashi et al. | 250/548 |
| 4,938,598 | 7/1990 | Akiyama et al. | 356/401 |
| 4,952,970 | 8/1990 | Suzuki et al. | 355/43 |

Primary Examiner—Richard A. Rosenberger
Assistant Examiner—K. P. Hantis
Attorney, Agent, or Firm—Fitzpatrick, Cella, Harper & Scinto

[57] ABSTRACT

A surface position detecting device including an irradiating optical system for irradiating first and second points on a surface with first and second light patterns, respectively; a light receiving optical system having an optical axis inclined with respect to the surface, for projecting upon a predetermined image plane images of the first and second light patterns on the surface, respectively, wherein the light receiving optical system includes a common primary optical and an auxiliary optical arrangement disposed between the predetermined image plane and the surface being examined, wherein the auxiliary optical arrangement includes first and second auxiliary optical systems for receiving light beams reflected respectively from the first and second points on the surface, independently of each other while the primary optical system receives both the light beams from the first and second points on the surface, and wherein a combined magnification of the primary optical system and the first auxiliary optical system is substantially equal to that of the primary optical system and the second auxiliary optical system; and a position detector for detecting positions of the images of the first and second light patterns upon the predetermined image plane.

56 Claims, 6 Drawing Sheets

SURFACE POSITION DETECTING DEVICE

This application is a continuation of prior application Ser. No. 07/658,232 filed Feb. 20, 1991, now abandoned.

FIELD OF THE INVENTION AND RELATED ART

This invention relates to a surface position detecting device and, more particularly, to a surface position detecting device of the type that radiation beams are projected onto different points on a surface being examined (such as a surface of a semiconductor wafer, for example) and, by using reflection beams therefrom, the surface height is detected with respect to the different points.

In many applications, a surface position detecting device for optically detecting height of a surface being examined has been used. As an example, in a reduction projection exposure apparatus for manufacture of semiconductor devices, in consideration of a necessity of precisely positioning the surface of a semiconductor wafer in a plane (image plane) optically conjugate with a plane of a pattern of a reticle with respect to a reduction projection lens system, an optical detection device for optically detecting the surface position of the semiconductor wafer is used. In such a detecting device, a plurality of beams of light are projected obliquely onto different points on the surface of a semiconductor wafer, and reflection light beams regularly reflected from the wafer surface are projected upon a photoelectric converting element. On the basis of signals from the photoelectric converting element, corresponding to the positions of incidence of the light beams upon its light receiving surface, the height or inclination of the wafer surface is detected.

SUMMARY OF THE INVENTION

It is a primary object of the present invention to provide a surface position detecting device of a simple structure, with which, with respect to different points on a surface to be examined, the surface height can be measured under substantially the same conditions through the use of plural light beams.

In accordance with an aspect of the present invention, to achieve this object, there is provided a surface position detecting device for detecting surface height at different points on a surface being examined, said device comprising: an irradiating optical system for irradiating first and second points on the surface with first and second light patterns, respectively; a light receiving optical system having an optical axis inclined with respect to the surface, for projecting upon a predetermined image plane images of the first and second light patterns on the surface, respectively, wherein said light receiving optical system includes a common primary optical and an auxiliary optical arrangement disposed between said predetermined image plane and the surface being examined, wherein said auxiliary optical arrangement includes first and second auxiliary optical systems for receiving light beams reflected respectively from the first and second points on the surface, independently of each other while said primary optical system receives both the light beams from the first and second points on the surface, and wherein a combined magnification of said primary optical system and said first auxiliary optical system is substantially equal to that of said primary optical system and said second auxiliary optical system; and a position detector for detecting positions of the images of the first and second light patterns upon said predetermined image plane.

In this surface position detecting device, substantially the same imaging magnification is assured for the first and second light patterns projected upon the predetermined image plane. As a result, the height (surface position) of each of the first and second points can be detected with the same resolution. Additionally, a part of the light receiving optical system can be used in common for detection of the height at the first and second points. Thus, the structure can be simple.

In one preferred form of the present invention, the irradiating optical system provides first and second light patterns of substantially the same size. When the first and second light patterns should be projected upon the surface, to be examined, at the same angle of incidence, the irradiating optical system may be made telecentric on its light emitting side.

In one preferred form of the present invention, when a surface of a semiconductor wafer is to be examined, the irradiating optical system provides first and second light patterns by use of light beams containing different color lights.

In the present invention, either the primary optical system or the auxiliary optical system may be disposed closer to the surface to be examined. However, when the present invention is applied to the surface position measurement with regard to each of different portions (shot areas) of a semiconductor wafer in a step-and-repeat type exposure apparatus (stepper), preferably the primary optical system may be disposed closer to the surface to be examined, for facilitating disposition of the auxiliary optical system.

The present invention is particularly suitably applicable to the surface position detection for a semiconductor wafer. Thus, within the scope of the present invention, there can be provided improved exposure apparatuses or improved methods of manufacture of semiconductor devices.

As an example, in accordance with an aspect of the present invention, there is provided an exposure apparatus, comprising: a stage on which a wafer is to be placed; directing means for directing an exposure beam to a first image plane, for exposure of the wafer to print a circuit pattern on the wafer; an irradiating optical system for irradiating first and second points on a surface of the wafer with first and second light patterns, respectively; a light receiving optical system having an optical axis inclined with respect to the wafer surface, for projecting upon a second image plane images of the first and second light patterns on the wafer surface, respectively, wherein said light receiving optical system includes a common primary optical and an auxiliary optical arrangement disposed between the wafer surface and said second image plane, wherein said auxiliary optical arrangement includes first and second auxiliary optical systems for receiving light beams reflected respectively from the first and second points on the wafer surface, independently of each other while said primary optical system receives both the light beams from the first and second points on the wafer surface, and wherein a combined magnification of said primary optical system and said first auxiliary optical system is substantially equal to that of said primary optical system and said second auxiliary optical system; detecting means for detecting positions of the images of the first and second light patterns upon said second image plane; and adjusting means for adjusting a positional relation of the wafer surface with said first image plane so that the wafer surface is brought into substantial coincidence with said first image plane.

Further, in accordance with another aspect of the present invention, there is provided a projection exposure apparatus, comprising: a stage on which a wafer is to be placed; a projection optical system having a first image plane, for projecting upon said first image plane an image of a circuit pattern; an irradiating optical system having an optical axis inclined with respect to a surface of the wafer, for irradiating first and second points in a zone of the surface of the wafer with first and second light patterns, respectively, of substantially the same size; a light receiving optical system having an optical axis inclined with respect to the wafer surface, for projecting upon a second image plane images of the first and second light patterns on the wafer surface, respectively, wherein said light receiving optical system includes a common primary optical and an auxiliary optical arrangement disposed between the wafer surface and said second image plane, wherein said auxiliary optical arrangement includes first and second auxiliary optical systems for receiving light beams reflected respectively from the first and second points on the wafer surface, independently of each other while said primary optical system receives both the light beams from the first and second points on the wafer surface, and wherein a combined magnification of said primary optical system and said first auxiliary optical system is substantially equal to that of said primary optical system and said second auxiliary optical system; detecting means for detecting positions of the images of the first and second light patterns upon said second image plane; and adjusting means for adjusting a positional relation of the wafer surface with said first image plane so that the wafer surface in the zone is brought into substantial coincidence with said first image plane.

Conveniently, the present invention is independent of the type of a radiation energy beam used for exposure of a wafer. Thus, for example, the present invention is applicable to an electron beam exposure method and apparatus, an X-ray exposure method and apparatus, a deep UV exposure method and apparatus using i-line light or a KrF excimer laser beam, and the like. Particularly, the present invention can be used suitably in a focusing operation to be made prior to an exposure operation in a stepper, a laser beam or electron beam patterning apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
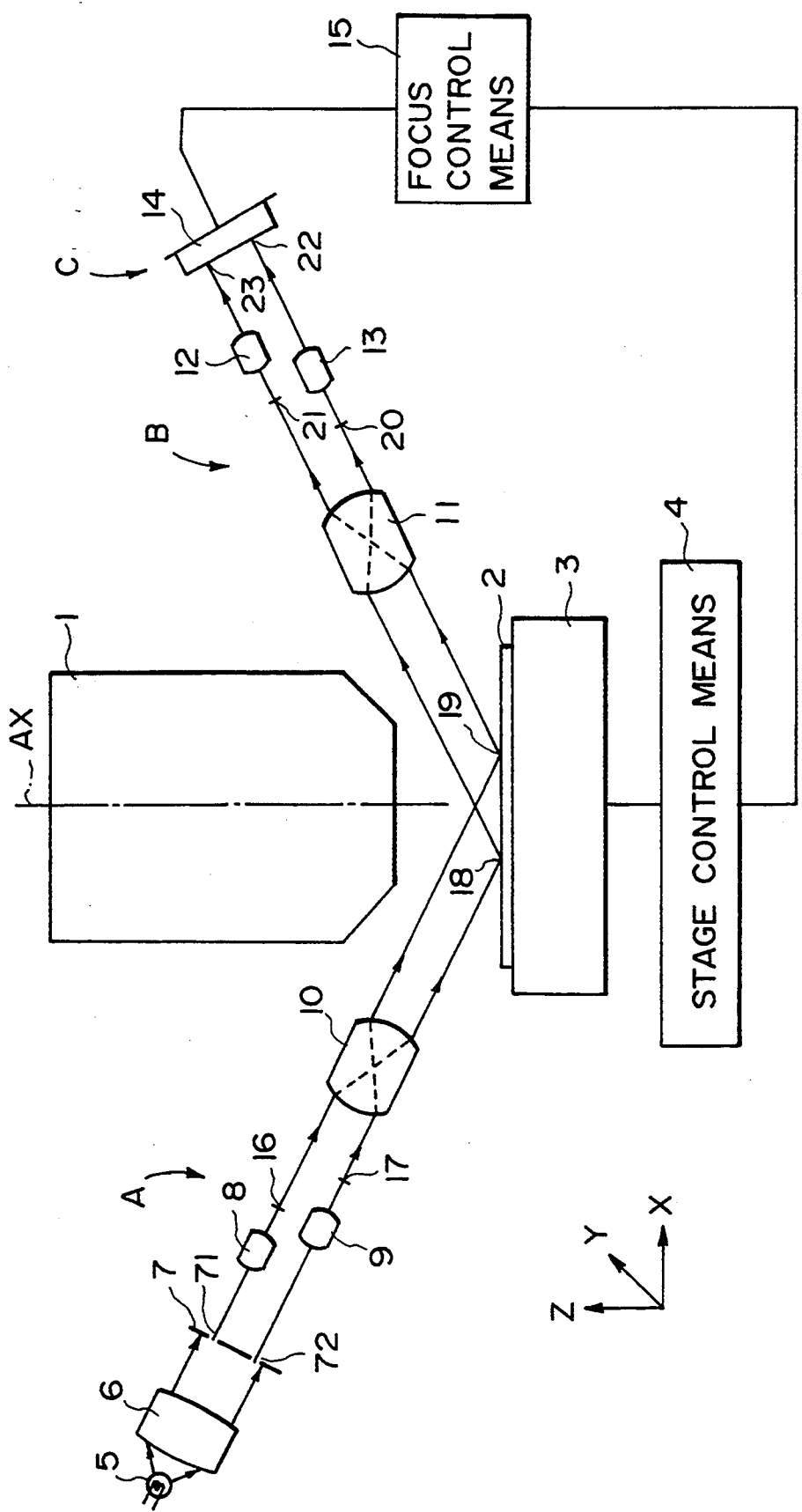
FIG. 1 is a schematic view of a surface position detecting device according to an embodiment of the present invention.

FIG. 1 is a schematic view of a surface position detecting device according to an embodiment of the present invention, wherein the device is incorporated into a reduction projection exposure apparatus for manufacture of semiconductor microcircuits.

In FIG. 1, denoted at 1 is a reduction projection lens system. Above the projection lens system 1, a reticle stage (not shown) is disposed and, above the reticle stage, an exposure illumination system (also not shown) is disposed. Reference character AX denotes the optical axis of the projection lens system 1. Denoted at 2 is a semiconductor wafer which is placed on a wafer stage 3 and held thereon by attraction. The wafer stage 3 is movable in a direction (Z-axis direction) of the optical axis AX of the projection lens system 1 and in two directions (X-axis and Y-axis directions) perpendicular to the optical axis AX. Also, the wafer stage 3 can operate to tilt the wafer 2 surface with respect to a plane (X-Y plane) which is orthogonal to the optical axis AX. Such motion control and inclination control of the wafer stage 3 with respect to the directions of X, Y and Z axes, are effected under the influence of a stage control means 4. By illuminating a circuit pattern of a reticle, placed on the reticle stage, with uniform illuminance of light from the exposure illumination system and by projecting an image of the circuit pattern of the reticle upon the wafer 2 through the projection lens system 1, the circuit pattern can be transferred and printed on the wafer 2. Here, the wafer 2 surface should be positioned exactly at a plane (image plane) which is optically conjugate with a plane of the circuit pattern of the reticle, with respect to the projection lens system 1.

For such surface position control of the wafer 2, there is provided a surface position detecting device which includes irradiating means (irradiating optical system) A, projecting means (light receiving optical system) B and photoelectric converting means C. As seen in FIG. 1, the irradiating means A and the projecting means B have their optical axes inclined with respect to the wafer 2 surface, by about 80 degrees, for example.

The irradiating means A includes a light source 5, a collimator lens 6, a slit 7, correction optical systems 8 and 9, and a lens system 10. The light source 5 comprises a white lamp, in this embodiment, which provides light of different wavelengths. The light from the light source 5 is transformed by the collimator lens 6 into parallel light having a substantially uniform sectional intensity distribution, which light in turn is directed to the slit 7. The slit 7 has two pinholes 71 and 72 formed therein, and these pinholes 71 and 72 have substantially the same size and shape. Each of the correction optical systems 8 and 9 comprises a lens system. The correction optical system 8 receives light passing through the pinhole 71 and serves to form an image of the pinhole 71 at a position 16 on the optical axis of the optical system 8. On the other hand, the correction optical system 9 receives light passing through the pinhole 72 and serves to form an image of the pinhole 72 at a position 17 on the optical axis of the optical system 9. The lens system 10 has its optical axis disposed eccentrically with respect to the optical axes of the correction optical systems 8 and 9. As illustrated, the positions 16 and 17 are at different distances from the lens system 10, along the respective optical axes. The lens system 10 receives both the lights of the images of the pinholes 71 and 72, respectively, as formed at the positions 16 and 17, respectively, and the lens system 10 serves to project the received lights obliquely upon the wafer 2. Also, the lens system 10 serves to re-image the image (light pattern) of the pinhole 71 at a measuring point 18 on the wafer 2 surface while, on the other hand, it serves to re-image the image (light pattern) of the pinhole 72 at another measuring point 19 on the wafer 2 surface. The measuring points 18 and 19 are at different positions with respect to the meridional direction of the projecting means B. The wafer 2 has a number of zones or pattern regions (shot areas) arrayed thereon, and the measuring points 18 and 19 are set, in a spaced relation, in one or in each of predetermined ones of these zones.

In this embodiment, the imaging magnification for the pinhole 71 by the correction optical system 8 is made different from that for the pinhole 72 by the correction optical system 9. Additionally, the surface of the wafer 2 and the plane that contains the positions 16 and 17 and that is inclined with respect to the optical axis of the lens system 10, are so set as to satisfy the Scheimpflug's condition with respect to the lens system 10. With this arrangement, the images of the pinholes 71 and 72 of the slit 7 can be formed on the wafer 2 surface at the same magnification. Here, if the imaging magnification for the pinhole 71 by the correction optical system 8 is denoted by $\beta_8$, the imaging magnification for the pinhole 72 by the correction optical system 9 is denoted by $\beta_9$, the imaging magnification for the pinhole image at the position 16 by the lens system 10 is denoted by $\beta_{10a}$ and the imaging magnification for the pinhole image at the position 17 by the lens system 10 is denoted by $\beta_{10b}$, then, the irradiating means A is arranged to satisfy the following relation:

$$\beta_{10a} \times \beta_8 = \beta_{10b} \times \beta_9$$

The projecting means B includes a common light receiving lens system 11 provided in common to the measuring points 18 and 19, two correction optical systems 12 and 13 provided in relation to the measuring points 18 and 19, respectively. Each of the correction optical systems 12 and 13 includes a parallel plate and a lens system. The parallel plate is provided as an element for the optical path correction, and the lens system is provided as an element for the magnification correction. In this example, the parallel plate and the lens system are disposed in this order from the light receiving lens system 11 side.

The photoelectric converting means C includes a CCD sensor 14 which is provided as a position detecting element.

When lights are projected by the irradiating means A upon the measuring points 18 and 19, these lights are reflected at the measuring points 18 and 19 and two reflection lights are produced. The light receiving lens system 11 receives these two reflection lights, namely, both the light from the pinhole image as formed at the measuring points 18 and the light from the pinhole image as formed at the measuring points 19. Thus, the light receiving lens system 11 directs the received lights to the correction optical systems 12 and 13, respectively. Here, the light receiving lens system 11 serves to re-image the pinhole image, formed at the measuring point 18, at a position 20 on the optical axis of the correction optical system 13, whereby an image of the pinhole 71 is formed thereat. On the other hand, the light receiving lens system 11 serves to re-image the pinhole image, formed at the measuring point 19, at a position 21 on the optical axis of the correction optical system 12, whereby an image of the pinhole 72 is formed thereat. The correction optical systems 12 and 13 have their optical axes disposed eccentrically with respect to the optical axis of the light receiving lens system 11 and, additionally, they have their optical axes disposed parallel to each other. Here, the correction optical system 13 receives the light from the pinhole image formed at the position 20 and directs it to a position 22 on the CCD sensor 14, whereby an image of the pinhole 71 (i.e. an image of the measuring point 18) is formed thereat. On the other hand, the correction optical system 12 receives the light from the pinhole image formed at the position 21 and directs it to a position 23 on the CCD sensor 14, whereby an image of the pinhole 72 (i.e. an image of the measuring point 19) is formed thereat. Thus, the measuring points 18 and 19 on the wafer 2 surface are placed in an optically conjugate relation with the light receiving surface of the CCD sensor 14 through the projecting means B. As a result, any inclination of the wafer 2 surface to the optical axis AX does not cause shift of the positions of the images of the pinholes 71 and 72, on the light receiving surface of the CCD sensor 14. On the other hand, the positions of the images of the pinholes 71 and 72 upon the light receiving surface of the CCD sensor 14 displace in response to a change in the surface position of the wafer 2 with respect to the optical axis AX direction, namely, a change in height of the measuring points 18 and 19.

In this embodiment, the imaging magnification as the correction optical system 13 re-images, upon the light receiving surface of the CCD 14, the pinhole image (image of the measuring point 18) formed at the position 20, is made different from that as the correction optical system 12 re-images, upon the light receiving surface of the CCD 14, the image (image of the measuring point 19) formed at the position 21. Additionally, with respect to the light receiving lens system 11, the surface of the wafer 2 and the plane that contains the positions 20 and 21 and that is inclined to the optical axis of the light receiving lens system 11, are set so as to satisfy the Scheimpflug's condition. With this arrangement, the images of the pinholes 71 and 72 (images of the measuring points 18 and 19) can be formed on the light receiving surface of the CCD 14, with the same magnification. As a result, the images of the pinholes 71 and 72 (images of the measuring points 18 and 19) as formed on the light receiving surface of the CCD 14 can have substantially the same size. Here, if the imaging magnification for the pinhole image at the measuring point 18 by the light receiving lens system 11 is denoted by $\beta_{11a}$, the imaging magnification for the pinhole image at the measuring point 19 by the light receiving lens system 11 is denoted by $\beta_{11b}$, the imaging magnification for the pinhole image at the position 20 by the correction optical system 13 is denoted by $\beta_{13}$ and the imaging magnification for the pinhole image at the position 21 by the correction optical system 12 is denoted by $\beta_{12}$, then the projecting means B is arranged to satisfy the following relation:

$$\beta_{11a} \times \beta_{13} = \beta_{11b} \times \beta_{12}.$$

The CCD 14 of the photoelectric converting means C produces signals corresponding to the positions of the images of the pinholes 71 and 72 (images of the measuring points 18 and 19) as formed on the light receiving surface thereof, and these signals are applied to a focus control means 15. Since the images formed on the light receiving surface of the CCD 14 have the same size and the same imaging magnification, the heights of the measuring points 18 and 19 can be detected with the same resolution and the same precision. On the basis of the output signals from the CCD 14, the focus control means 15 detects the height information with regard to the measuring points 18 and 19 and determines the surface position of the wafer 2, i.e., the position thereof with respect to the Z-axis direction (optical axis AX direction) and/or any inclination of the wafer 2 surface with respect to the X-Y plane. Then, the focus control means 15 supplies to the stage control means 4 a signal corresponding to a necessary quantity of drive of the wafer stage 3, necessary for positioning the wafer 2 surface into the plane (image plane) which is optically conjugate with the plane of the circuit pattern of the reticle with respect to the projection lens system 1. In response to the supplied signal, the stage control means 4 drives the wafer stage 3, whereby the position and/or attitude of the wafer 2 can be adjusted.

Figure 2:
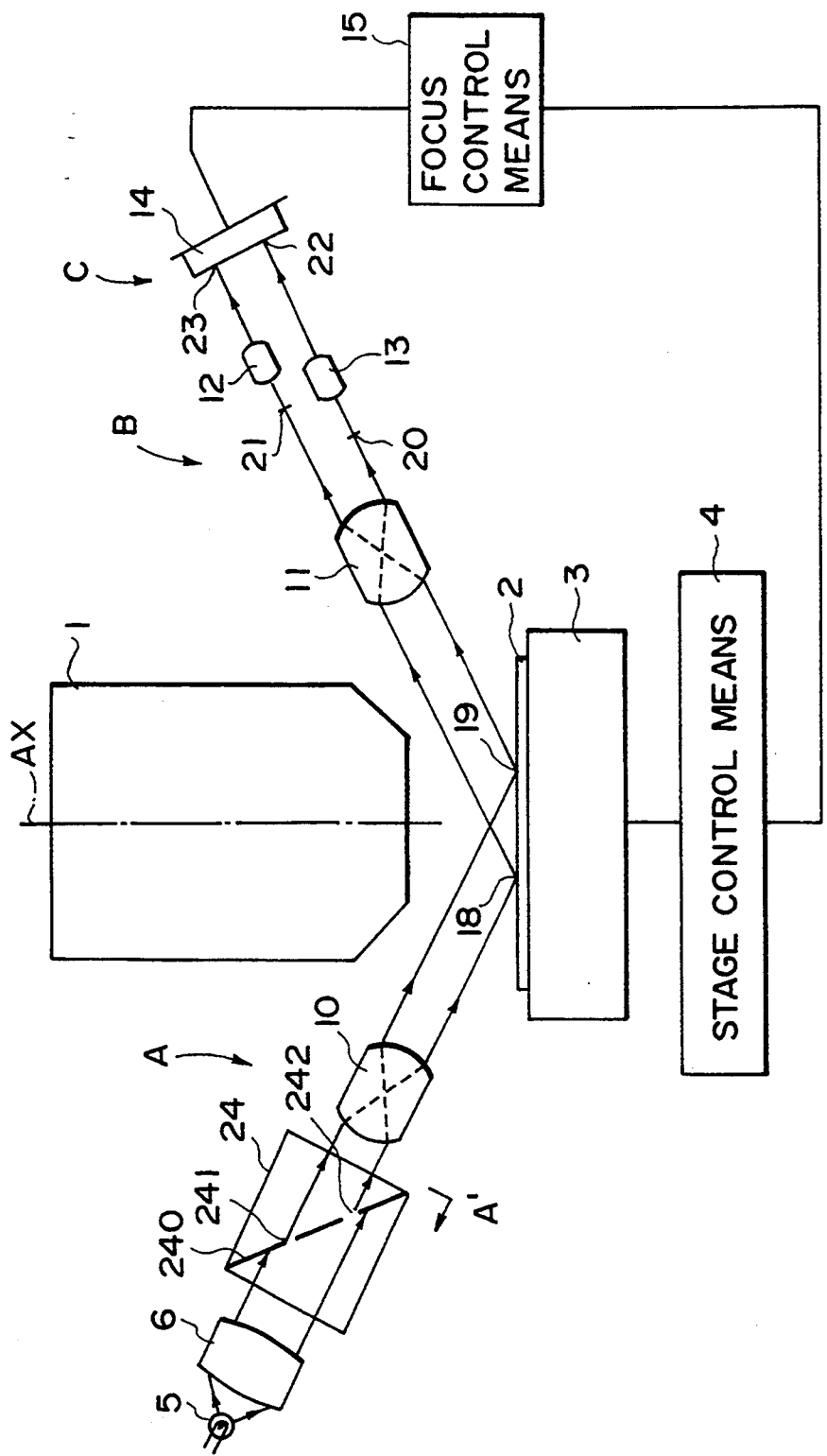
FIG. 2 is a schematic view of a modified form of the FIG. 1 embodiment.

FIG. 2 is a schematic view, showing a modified form of the surface position detecting device of the FIG. 1 embodiment. In FIG. 2, like numerals as in FIG. 1 are assigned to corresponding elements, and description of them is omitted here.

Figures 3, 4:
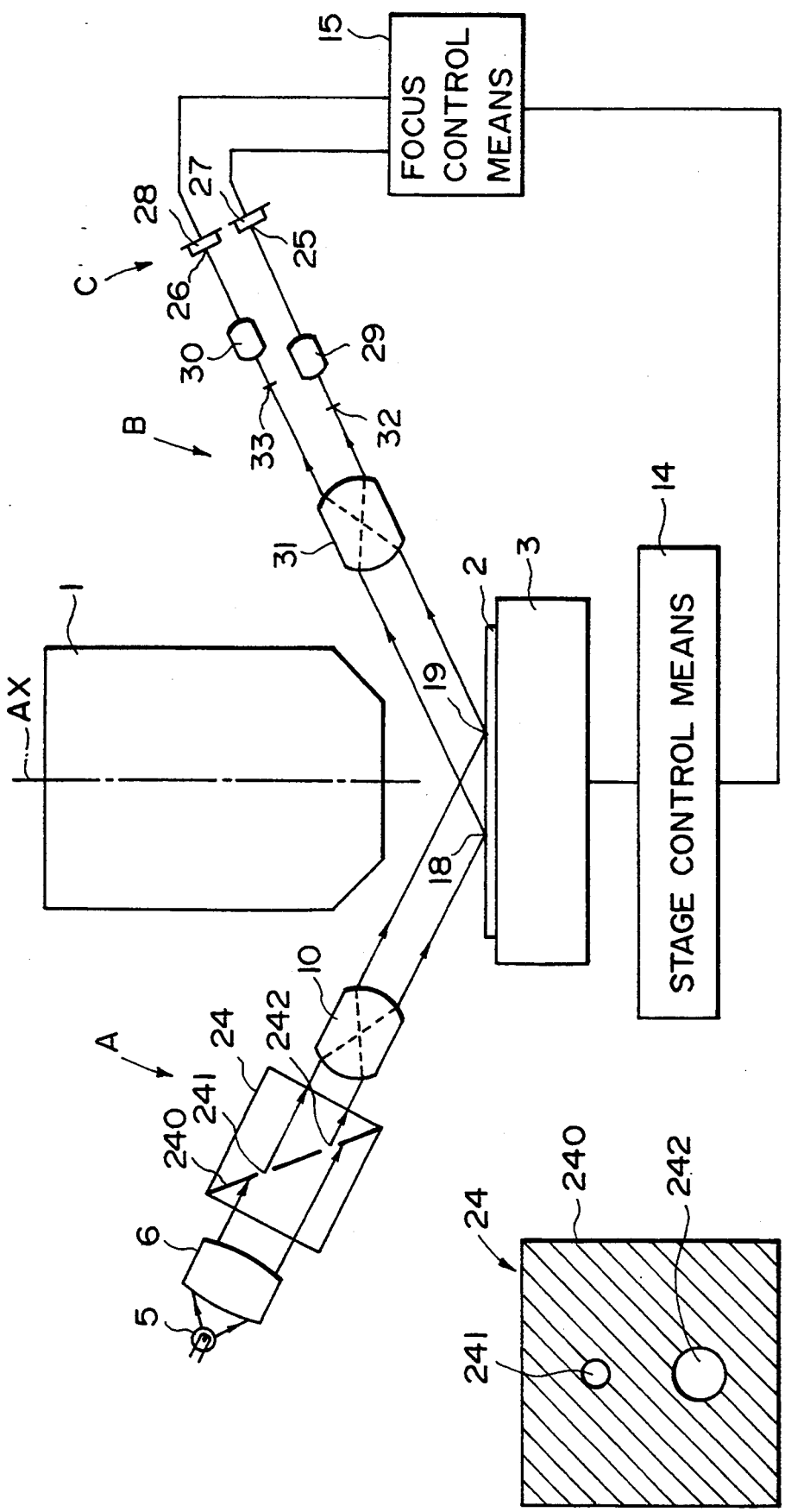
FIG. 3 is a plan view of a slit of an optical block shown in FIG. 2.
FIG. 4 is a schematic view of a modified form of the device shown in FIGS. 2 and 3.

The device of the present embodiment has a feature that an optical block 24 is provided in place of the slit 7 and the correction optical systems 8 and 9 of FIG. 1. The optical block 24 is made by cementing a pair of prisms to each other, with their slant surfaces opposed to each other. At the cemented surface, a slit 240 is provided. The slit 240 has pinholes 241 and 242 formed therein. The position of the pinhole 241 with respect to the lens system 10 and the position of the pinhole 242 with respect to the lens system 10, correspond to the positions 16 and 17 in FIG. 1, respectively. Also, the surface of the wafer 2 and the plane containing the slit 240 satisfy the Scheimpflug's condition, with respect to the lens system 10. Thus, the imaging magnification for the pinhole 241 by the lens system 10 is $\beta_{10a}$, while the imaging magnification for the pinhole 242 by the lens system 10 is $\beta_{10b}$. Here, since $\beta_{10a} \neq \beta_{10b}$, in this embodiment, in order that images of the pinholes 241 and 242 are formed on the wafer 2 surface substantially in the same size, the pinholes 241 and 242 of the slit 240 are so sized and shaped as shown in FIG. 3. FIG. 3 is a view of the slit 240, as seen in the direction of the optical axis of the lens system 10, and the hatched area in the drawing depicts the light blocking portion which can be defined by forming a light blocking portion (film), with chromium or the like, on one of the prisms constituting the optical block 24. The blank areas in the drawing depict the pinholes, as denoted at 241 and 242. When the diameter of the pinhole 241 is Da and the diameter of the pinhole 242 is Db, the diameters Da and Db are set to satisfy the following relation:

$$Da/Db = \beta_{10b}/\beta_{10a}$$

With this setting, pinhole images of substantially the same size can be formed at the measuring points 18 and 19, respectively, on the wafer 2 surface.

The projecting means B and the photoelectric converting means C of the surface position detecting device of the present embodiment, have the same functions as those of the FIG. 1 device, and similar effects are obtainable as the device of FIG. 1. Further, the present embodiment can provide a surface position detecting device with an additional advantage of reduction in size of the structure of the irradiating means A, as compared with the FIG. 1 device.

FIG. 4 is a schematic view, showing a modified form of the surface position detecting device of FIGS. 2 and 3. In FIG. 4, like numerals as those of FIGS. 1–3 are assigned to corresponding elements, and description of them is omitted here.

Features of the present embodiment as compared with the device of FIGS. 2 and 3, reside in: that the light receiving lens system 11 of FIG. 2 is replaced by a light receiving lens system 31 of relatively low magnification, which is telecentric on the light emitting side; that correction optical systems 29 and 30 of relatively low magnification, each being telecentric on its light emitting side, are added; and that the CCD 14 of FIG. 2 is replaced by two position sensor diodes (PSD) 27 and 28. Reference numeral 32 in FIG. 4 denotes the imaging position of the measuring point 18 through the light receiving lens system 31. Similarly, reference numeral 33 denotes the imaging position of the measuring point 19 through the light receiving lens system 31. Also, output signals from the two position sensor diodes 27 and 28 are applied to the focus control means 15.

When a CCD sensor is used as an element of the photoelectric converting means C, as in the preceding embodiment, there is an advantage that the positions of two lights (two pinhole images) can be detected by a single element. However, the resolution of such a CCD is lower than that of a PSD, and it requires a longer measurement time. Therefore, if a CCD is used, it may be necessary to use a large imaging magnification for each of the light receiving lens system 11 and the correction optical systems 12 and 13 of FIGS. 1 and 2, to thereby enhance the resolution for the height detection with respect to the measuring points 18 and 19 on the wafer 2 surface. Also, it may be necessary to use an expensive signal processing circuit, for shortening the measurement time. In the present embodiment, in consideration thereof, two position sensor diodes 27 and 28 are used as an element of the photoelectric converting means C. With this structure, when images of the pinholes 241 and 242 formed at the measuring points 18 and 19 on the wafer 2 surface are formed at positions 32 and 33 through the lower-magnification light receiving lens system 31 and when they are re-imaged at positions 25 and 26 on the position sensor diodes 27 and 28, respectively, through the lower-magnification correction optical systems 29 and 30, respectively, it is still possible to ensure substantially the same resolution of surface position detection for the wafer, as in the preceding embodiment wherein a CCD is used.

Further, only a simple and inexpensive processing circuit is necessary for the PSD 27 or 28, and the measurement time is short.

With the structure of the present embodiment, the magnification of the optical system of the projecting means B can be made low, and it is possible to provide a surface position detecting device which is small in size, low in cost and short in measurement time.

Also, since in this embodiment the light receiving lens system 31 and the correction optical systems 29 and 30 each is telecentric on its light emitting side, the paths for the lights after the light receiving lens system 31 of the projecting means B become parallel to each other. This makes it possible to use simple and inexpensive parts such as a barrel for supporting the optical system of the projecting means, for example. Additionally, the lights reflected by the wafer 2 surface can always be incident on the position sensor diodes 27 and 28 substantially perpendicularly. As a result, a maximum and constant photoelectric conversion efficiency of the position sensor diodes 27 and 28 is assured for the height detection to the measuring points 18 and 19 on the wafer 2 surface.

The correction optical systems 29 and 30 used in this embodiment each comprises a parallel plate for path length correction and a lens system for magnification correction, as in the present embodiment. Thus, substantially the same advantageous results are obtainable with the device of this embodiment.

Figure 5:
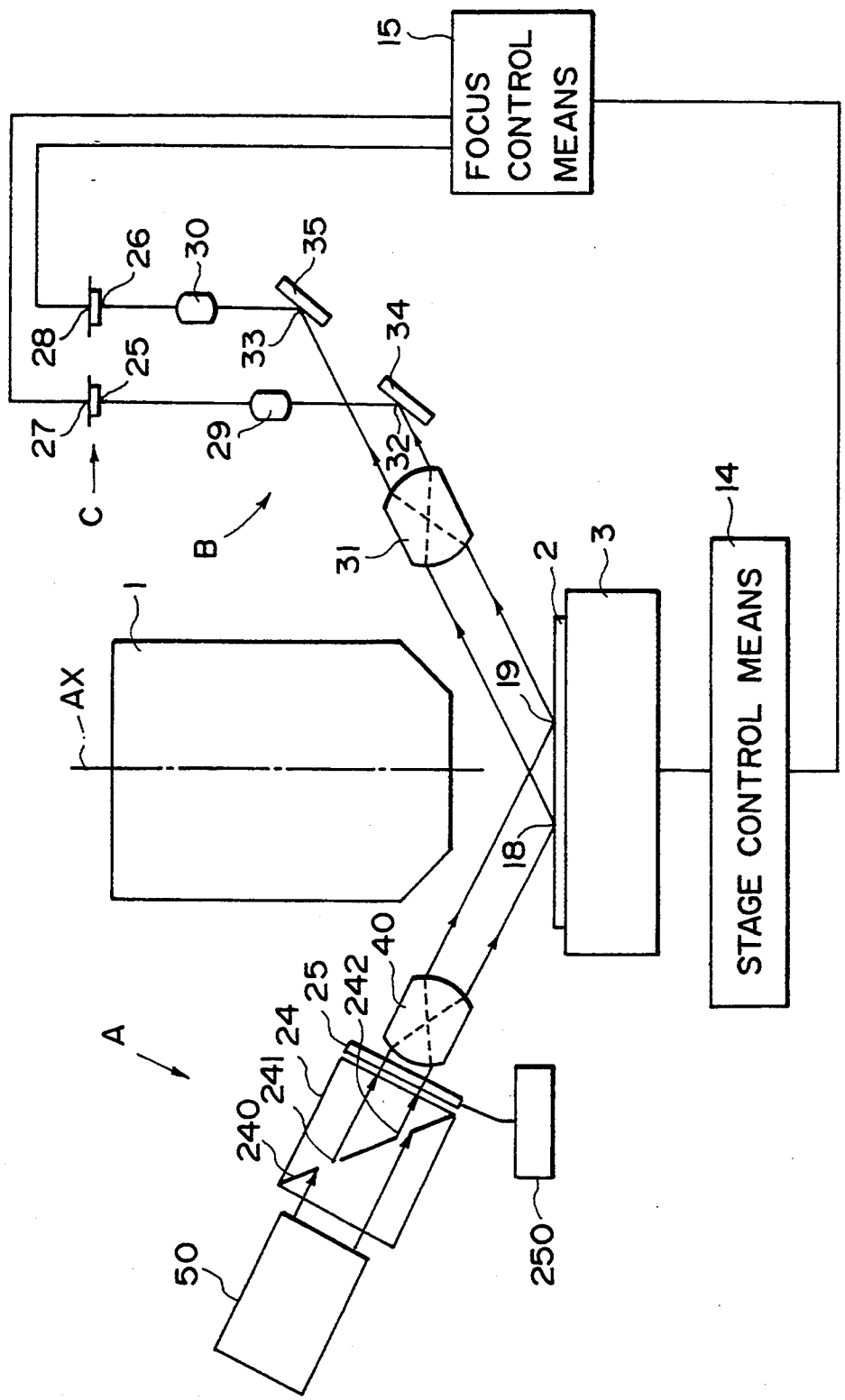
FIG. 5 is a schematic view of a modified form of the FIG. 4 device.

FIG. 5 is a schematic view of a modified form of the surface position detecting device shown in FIG. 4. In FIG. 5, like numerals as those of FIGS 1-4 are assigned to corresponding elements, and description of them is omitted here.

Figure 7:
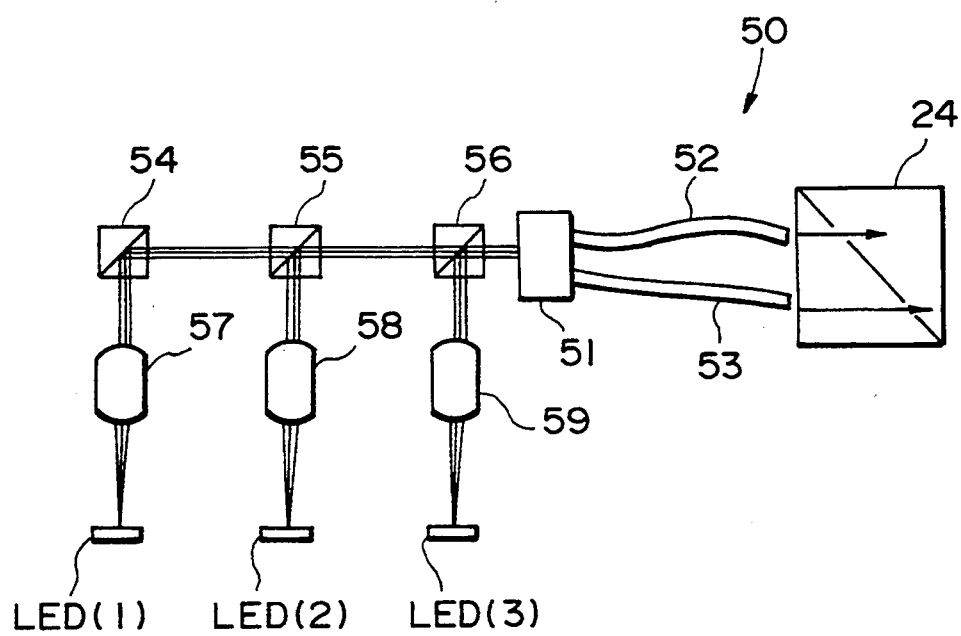
FIG. 7 is a schematic view, showing an example of an illumination unit.

Features of the device of this embodiment as compared with the device shown in FIG. 4 reside in: that a deflecting mirror 34 is provided between the light receiving lens system 31 and the correction optical system 29, while another deflecting mirror 35 is provided between the light receiving lens system 31 and the correction optical system 30; that an illumination unit 50 such as shown in FIG. 7 is provided in place of the light source 5 and the collimator lens system; that a lens system 40 which is telecentric on the light emitting side is provided in place of the lens system 10; that a rotationally movable parallel plate 25 is provided between the lens system 40 and the optical block 24; and that an adjusting mechanism 250 for rotationally moving the parallel plate 25 to adjust inclination thereof with respect to the lens 40, is added.

As shown in FIG. 5, the deflecting mirror 34 is so set that its reflection surface is placed at an imaging position 32 of the measuring point 18 through the light receiving lens system 31. The mirror 34 receives the reflection light from the measuring point 18, passed through the light receiving lens system 31, and it reflects the same while deflecting the light path so that it extends parallel to the optical axis AX, toward the correction optical system 29. On the other hand, the deflecting mirror 35 is so set that its reflection surface is placed at an imaging position 33 of the measuring point 19 through the light receiving lens system 31. The mirror 35 receives the reflection light from the measuring point 19, passed through the light receiving lens system 31, and it deflects the path so that the same extends parallel to the optical axis AX, toward the correction optical system 30. By providing the mirrors 34 and 35 at those positions which are optically conjugate with the wafer 2 surface, it is possible to reduce the size of each mirror 34 or 35. In addition thereto, any change in inclination of the mirror 34 or 35 does not affect the detection precision. Further, disposition of the optical arrangement is facilitated (as an example, the spacing between the correction optical systems 29 and 30 can be enlarged, as illustrated).

As shown in FIG. 7, the illumination unit 50 includes three light emitting diodes LED (1), LED (2) and LED (3), which produce lights of different wavelengths, a mirror 54, dichroic mirrors 55 and 56, a light divider 51, optical fibers 52 and 53, and condenser lenses 57, 58 and 59. Light from the LED (1) is transformed by the lens 57 into parallel light which in turn is directed to the mirror 54. Light from the LED (2) is transformed by the lens 58 into parallel light which in turn is directed to the dichroic mirror 55. Light from the LED (3) is transformed by the lens 59 into parallel light which in turn is directed to the dichroic mirror 56. The parallel light reflected by the mirror 54 is directed to the dichroic mirror 57, and the parallel light reflected by the mirror 55 is superposed on the parallel light from the mirror 54 and the combined light is directed to the dichroic mirror 56. The parallel light reflected by the mirror 56 is superposed on the parallel light from the mirror 55, and the combined light is directed to the light divider 51. In this manner, multi-color light beams containing light of three different wavelengths ($\lambda_1$, $\lambda_2$ and $\lambda_3$) are incident on the light divider 51. The light divider 51 divides the received light into two beams of light having the same intensity, and it inputs one of the beams into the optical fiber 52 while it inputs the other light beam into the optical fiber 53. Through the optical fiber 52, the light is projected to a pinhole 241 formed in the optical block 24, and through the optical fiber 53 the light is projected to another pinhole 242 formed in the optical block 24.

Use of such an illumination unit 50 in this embodiment makes it possible to effectively utilize the lights from the light sources LED (1)–LED (3) and, for this reason, bright pinhole images having substantially the same intensity can be formed at the measuring points 18 and 19 on the wafer 2 surface.

Since the optical block 24 has a box-like shape, as shown in FIG. 5, it can be very easily incorporated as a component of the irradiating means A. By disposing the light emission ends of the optical fibers 52 and 53 close to the light input surface of the optical block 24, the lights from the optical fibers 52 and 53 can be efficiently inputted to the pinholes 241 and 242 of the slit 240, respectively. The parallel plate 25 is provided to shift, when the optical block 24 is inclined relative to the optical axis of the lens system 40, the path of light emanating from the optical block 24, to a desired position. The adjusting mechanism 250 serves to tilt the parallel plate 25 relative to the optical axis of the lens system 40 to adjust the angle of inclination thereof. By this, it is possible to shift the path of light emanating from the optical block 24, while maintaining the parallelism with the optical axis of the lens system 40.

Since in this embodiment the lights from the pinholes 241 and 242 are directed to the measuring points 18 and 19 on the wafer 2 surface through the lens system 40 which is telecentric on the light emission side, the lights can be incident upon the measuring points 18 and 19 at substantially the same angle of incidence. The reflectivity of the wafer 2 surface changes, depending upon the angle of incidence of the light inputted thereto. However, by providing the same angle of incidence to the lights impinging on the measuring points 18 and 19, as in the present embodiment, the intensities of reflection lights from the measuring points 18 and 19 can be made substantially equal to each other. Thus, there is an advantage of attainment of substantially the same precision in the height detection to the measuring points 18 and 19.

While in this embodiment the lens system 40 comprises an optical system which is telecentric on the light emission side, an optical system which is telecentric on both the light entrance side and the light emission side may be used. Similarly, with regard to the light receiving lens system 31 and the correction optical systems 29 and 30, an optical system which is telecentric both on the light entrance side and on the light emission side, may be used.

Further, in place of the telecentric arrangement on the light emission side of the lens system 40, the light receiving lens system 31 or the correction optical systems 29 and 30, modifications may be made to the irradiating means A or the projecting means B, by providing a prism in the optical path of a corresponding lens system or optical system to change the orientation of the optical path. As an example, in the device shown in FIGS. 1 and 2, prisms may be provided between the correction optical system 12 and the CCD 14 and between the correction optical system 13 and the CCD 14, such that the paths of the lights from the correction optical systems 12 and 13 become perpendicular to the light receiving surface of the CCD 14.

In some embodiments having been described with reference to FIGS. 1–5 and 7, two points are selected as the measuring points for the surface position detection and two light beams are used for this purpose. However, the height detection may be made with regard to more than three points by using more than three light beams.

Figure 6:
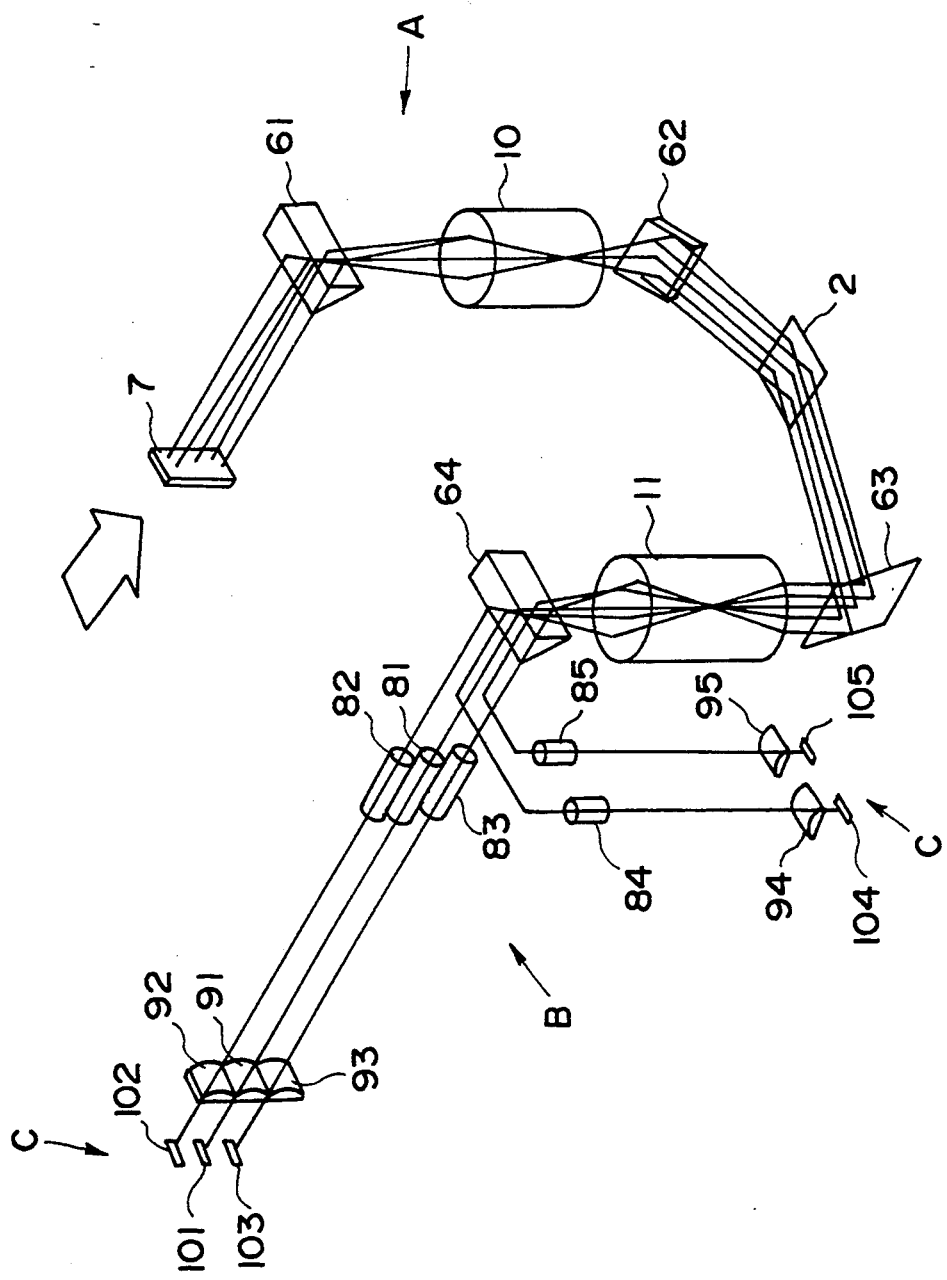
FIG. 6 is a schematic view of a major part of a surface position detecting device according to another embodiment of the present invention.

FIG. 6 is a schematic view of an embodiment wherein the heights at five measuring points on a wafer surface are detected by use of five light beams.

In FIG. 6, the slit 7 has five pinholes formed therein, and these five pinholes correspond to the measuring points at the center of a pattern region of a wafer 2 and at four peripheral points around it. Reference numerals 61, 62, 63 and 64 denote deflection mirrors which serve to deflect the optical paths through the irradiating means A and the projecting means B. Namely, these mirrors are contributable for reduction in size of the detection device as a whole. Denoted at 81, 82, 83, 84 and 85 are correction optical systems, respectively, each comprising a lens system and a parallel plate. Denoted at 91, 92, 93, 94 and 95 are cylindrical lenses, respectively, each being adapted to collect a received light with respect to a direction perpendicular to the lengthwise direction of a corresponding one of position sensor diodes 101, 102, 103, 104 and 105. These cylindrical lenses are provided so as to efficiently direct the reflection light from the wafer 2 surface to the position sensor diodes 101–105.

Five light beams passing through the pinholes of the slit 7 are directed to the mirror 61, to the lens system 10 and to the mirror 62, and they are projected onto corresponding measuring points on the wafer 2 to thereby form images of the pinholes, of the same size. Five reflection lights produced as a result of reflection of the inputted light beams at respective measuring points, are directed to the mirror 63, to the light receiving lens system 11 and to the mirror 64, and they are inputted to corresponding correction optical systems 81, 82, 83, 84 and 85, respectively. After this, through corresponding cylindrical lenses 91–95, they are directed to corresponding position sensor diodes 101–105.

Also in this embodiment, by means of the correction optical systems 81–85, images of the measuring points on the wafer 2 surface (i.e. images of the pinholes) are projected on the light receiving surfaces of the position sensor diodes 101–105, respectively, with the same size and the same imaging magnification. Thus, by using the position sensor diodes 101–105 of the same performance, it is possible to detect the heights of different measuring points on the wafer 2 surface, with substantially the same resolution and precision. By adjusting the height and inclination of the wafer 2 surface by using the results of such detection, it is possible to position the wafer 2 surface exactly at the image plane of a projection lens system (not shown), with a significantly enhanced precision.

By applying the concept of each embodiment of FIGS. 1–5 and 7 to the device shown in FIG. 6, appropriately, it is possible to embody various types of surface position detecting devices.

While in the foregoing embodiments the photoelectric converting means C comprises a CCD or PSD, the photoelectric converting means C is not limited to one using this type of position detecting element. Namely, any other means may be used provided that it can detect the position or displacement of an image of each measuring point which changes in response to a change in the height of that measuring point on the wafer surface. Examples are: a photoelectric converting device of the type that an oscillating slit is provided in a plane optically conjugate with the wafer surface; and a photoelectric converting device of the type that a stationary slit is provided in a plane optically conjugate with the wafer surface while an image of a measuring point is scanningly moved relative to the slit. Similarly, the structure of the irradiating means A or the projecting means B may be modified appropriately in consideration of the use of the device or the like.

In the embodiments described hereinbefore, each of the irradiating means A and the projecting means B includes a common optical system to plural light beams used for the height detection with respect to plural measuring points on a wafer surface to be examined. This allows not only reduction in size of the device as a whole but also reduction in cost of the same. Additionally, at least the projecting means B is provided with separate correction optical systems for the plural light beams, respectively, and by using these optical systems, the same imaging magnification is assured to the plural light beams, such that images of the measuring points can be projected upon the photoelectric converting means, in the same size. Thus, there is a significant advantage that the heights of different measuring points can be detected substantially at the same precision.

Particularly when the device of the present invention is incorporated into a semiconductor device manufacturing projection exposure apparatus, even though the numerical aperture (NA) of a projection lens system is increasing and the depth of focus thereof is decreasing for enhancement in the degree of integration of each semiconductor device, throughout the entire exposure zone (shot area) which is being enlarged, position detection with respect to different measuring points can be done at the same measurement precision and, thus, the entire surface of the exposure zone can be brought into coincidence with a reticle imaging plane of the projection lens system. Accordingly, throughout the exposure zone, uniformness of resolution is assured and, therefore, high-resolution patterning is ensured.

While in the foregoing embodiments the stage 3 is moved upwardly or downwardly so as to bring the wafer 2 surface into coincidence with the image plane of the projection lens system 1, in place thereof the projection lens system 1 may be moved vertically. Alternatively, the focal length of the projection lens system 1 may be changed to shift the image plane relative to the wafer 2 surface, so as to obtain coincidence of the image plane and the wafer 2 surface.

Further, while in the foregoing embodiments a plurality of light beams are projected on the wafer 2 surface simultaneously, plural light beams may be sequentially projected to corresponding points. As an example, the light divider 51 of FIG. 7 may be omitted and the optical fibers 52 and 53 may be replaced by a single optical fiber, such that light is alternately supplied to two openings.

As a light source, a semiconductor laser may be used in place of a white lamp or a light emitting diode (LED).

The projection exposure apparatus to which the present invention is applicable, is not limited to a reduction projection type using a reduction lens system. That is, the present invention is applicable to one using a reduction mirror system or a unit-magnification lens or mirror system.

With the device according to the present invention, the height detection with respect to different points on a surface to be examined is made by using plural light beams and a simple structure, under substantially the same conditions.

While the invention has been described with reference to the structures disclosed herein, it is not confined to the details set forth and this application is intended to cover such modifications or changes as may come within the purposes of the improvements or the scope of the following claims.

What is claimed is:

1. A surface position detecting device for detecting surface height at different portions of a surface being examined, said device comprising:

an irradiating optical system for irradiating first and second portions of the surface with first and second light beams, respectively, said irradiating optical system including a first limiting portion for limiting the first light beam so that the first light beam is projected to the first portion of the surface and a second limiting portion for limiting the second light beam so that the second light beam is projected to the second portion of the surface, wherein an image of the first limiting portion is formed on the first portion of the surface while an image of the second limiting portion is formed on the second portion of the surface;

a light receiving optical system having an optical axis inclined with respect to the surface, for projecting upon a predetermined image plane images of the first and second irradiated portions of the surface, respectively, wherein said light receiving optical system comprises a common primary optical and an auxiliary optical arrangement disposed between said predetermined image plane and the surface being examined, wherein said auxiliary optical arrangement comprises first and second auxiliary optical systems for receiving the first and second light beams reflected respectively from the first and second portions of the surface, independently of each other while said primary optical system receives both the first and second light beams from the first and second portions of the surface, and wherein a combined magnification of said primary optical system and said first auxiliary optical system, for the projection of the image of the first portion, is substantially equal to that of said primary optical system and said second auxiliary optical system, for the projection of the image of the second portion; and position detecting means for detecting positions of the images of the first and second portions upon said predetermined image plane.

2. A device according to claim 1, wherein the first and second light beams, on the surface, have substantially the same size.

3. A device according to claim 2, wherein said light receiving optical system has an intermediate image plane which is correlated with the surface being examined, to satisfy a Scheimpflug's condition, with respect to said primary optical system, wherein said primary optical system serves to image each of the first and second portions upon the intermediate image plane, wherein said first auxiliary optical system serves to re-image the image of the first portion on said intermediate image plane, upon said predetermined image plane, and wherein said second auxiliary optical system serves to re-image the image of the second portion on said intermediate image plane, upon said predetermined image plane.

4. A device according to claim 3, wherein said irradiating optical system has an optical axis inclined with respect to the surface being examined, and is telecentric on its light emitting side.

5. A device according to claim 4, wherein said primary optical system of said light receiving optical system is telecentric both on a light entrance side and on a light emission side.

6. A device according to claim 3, wherein said irradiating optical system produces each of the first and second light beams with a light beam containing different color lights.

7. A device according to claim 3, wherein said position detecting means comprises a sensor having a light receiving surface disposed coincident with said predetermined image plane, for photoelectrically converting the images of the first and second portions.

8. A device according to claim 3, wherein said position detecting means comprises a first sensor for photoelectrically converting the image of the first portion and a second sensor, separate from said first sensor, for photoelectrically converting the image of the second portion, and wherein said first and second sensors have light receiving surfaces disposed coincident with said predetermined image plane.

9. A device according to claim 3, wherein said irradiating optical system comprises a light source, a stop member including said first and second limiting portions, which respectively comprise first and second openings of different sizes, for defining the first and second light beams, respectively, said first and second openings being located along a plane inclined with respect to the optical axis of said irradiating optical system, illumination means for illuminating said stop member with light from said light source, and an imaging optical system being telecentric on its side facing the surface to be examined, for projecting upon the surface images of said first and second openings illuminated by said illumination means.

10. A device according to claim 3, wherein the first and second portions are at positions which are different from each other with respect to a meridional direction of said light receiving optical system.

11. A device according to claim 1, wherein said position detecting means comprises a sensor having a light receiving surface disposed coincident with said predetermined image plane, for photoelectrically converting the images of the first and second portions.

12. A surface position detecting device for detecting surface height at different portions of a surface being examined, said device comprising:

an irradiating optical system for irradiating first and second portions of the surface with first and second light beams, respectively;

a light receiving optical system having an optical axis inclined with respect to the surface, for projecting upon a predetermined image plane images of the first and second irradiated portions of the surface, respectively, wherein said light receiving optical system comprises a common primary optical and an auxiliary optical arrangement disposed between said predetermined image plane and the surface being examined, wherein said auxiliary optical arrangement comprises first and second auxiliary optical systems for receiving the first and second light beams reflected respectively from the first and second portions of the surface, independently of each other while said primary optical system receives both the first and second light beams from the first and second portions of the surface, and wherein a combined magnification of said primary optical system and said first auxiliary optical system, for the projection of the image of the first portion, is substantially equal to that of said primary optical system and said second auxiliary optical system, for the projection of the image of the second portion; and position detecting means for detecting positions of the images of the first and second portions upon said predetermined image plane, wherein the first and second light beams, on the surface, have substantially the same size, said light receiving optical system has an intermediate image plane which is correlated with the surface being examined, to satisfy a Scheimpflug's condition, with respect to said primary optical system, wherein said primary optical system serves to image each of the first and second portions upon the intermediate image plane, wherein said first auxiliary optical system serves to re-image the image of the first portion on said intermediate image plane, upon said predetermined image plane, and wherein said second auxiliary optical system serves to re-image the image of the second portion on said intermediate image plane, upon said predetermined image plane, and each of said first and second auxiliary optical systems comprises first and second reflecting mirrors each being disposed adjacent said intermediate image plane.

13. A surface position detecting device for detecting surface height at different portions of a surface being examined, said device comprising:

an irradiating optical system for irradiating first and second portions of the surface with first and second light beams, respectively;

a light receiving optical system having an optical axis inclined with respect to the surface, for projecting upon a predetermined image plane images of the first and second irradiated portions of the surface, respectively, wherein said light receiving optical system comprises a common primary optical and an auxiliary optical arrangement disposed between said predetermined image plane and the surface being examined, wherein said auxiliary optical arrangement comprises first and second auxiliary optical systems for receiving the first and second light beams reflected respectively from the first and second portions of the surface, independently of each other while said primary optical system receives both the first and second light beams from the first and second portions of the surface, and wherein a combined magnification of said primary optical system and said first auxiliary optical system, for the projection of the image of the first portion, is substantially equal to that of said primary optical system and said second auxiliary optical system, for the projection of the image of the second portion; and position detecting means for detecting positions of the images of the first and second portions upon said predetermined image plane, wherein the first and second light beams, on the surface, have substantially the same size, said light receiving optical system has an intermediate image plane which is correlated with the surface being examined, to satisfy a Scheimpflug's condition, with respect to said primary optical system, wherein said primary optical system serves to image each of the first and second portions upon the intermediate image plane, wherein said first auxiliary optical system serves to re-image the image of the first portion on said intermediate image plane, upon said predetermined image plane, and wherein said second auxiliary optical system serves to re-image the image of the second portion on said intermediate image plane, upon said predetermined image plane, said irradiating optical system comprises a light source, a stop member having first and second openings of different sizes, for defining the first and second light beams, respectively, said first and second openings being located along a plane inclined with respect to the optical axis of said irradiating optical system, illumination means for illuminating said stop member with light from said light source, and an imaging optical system being telecentric on its side facing the surface to be examined, for projecting upon the surface images of said first and second openings illuminated by said illumination means, and said stop member comprises a cube-like structure including a pair of rectangular prisms cemented to each other with their slant surfaces opposed to each other, and wherein a light, blocking film having said first and second openings formed therein is provided on one of the slant surfaces of said rectangular prisms.

14. A device according to claim 13, wherein said irradiating optical system further comprises a parallel plate movably disposed between said stop member and said imaging optical system, for adjusting inclination thereof with respect to the optical axis of said irradiating optical system.

15. A surface position detecting device for detecting surface height at different portions of a surface being examined, said device comprising:

an irradiating optical system for irradiating first and second portions of the surface with first and second light beams, respectively;

a light receiving optical system having an optical axis inclined with respect to the surface, for projecting upon a predetermined image plane images of the first and second irradiated portions of the surface, respectively, wherein said light receiving optical system comprises a common primary optical and an auxiliary optical arrangement disposed between said predetermined image plane and the surface being examined, wherein said auxiliary optical arrangement comprises first and second auxiliary optical systems for receiving the first and second light beams reflected respectively from the first and second portions of the surface, independently of each other while said primary optical system receives both the first and second light beams from the first and second portions of the surface, and wherein a combined magnification of said primary optical system and said first auxiliary optical system, for the projection of the image of the first portion, is substantially equal to that of said primary optical system and said second auxiliary optical system, for the projection of the image of the second portion; and position detecting means for detecting positions of the images of the first and second portions upon said predetermined image plane, wherein the first and second light beams, on the surface, have substantially the same size;

said light receiving optical system has an intermediate image plane which is correlated with the surface being examined, to satisfy a Scheimpflug's condition, with respect to said primary optical system, wherein said primary optical system serves to image each of the first and second portions upon the intermediate image plane, wherein said first auxiliary optical system serves to re-image the image of the first portion on said intermediate image plane, upon said predetermined image plane, and wherein said second auxiliary optical system serves to re-image the image of the second portion on said intermediate image plane, upon said predetermined image plane, and said irradiating optical system comprises a light source, a stop member having first and second openings of the same size, for defining the first and second light beams, respectively, illumination means for illuminating said stop member with light from said light source, a first imaging optical system for forming, at a first magnification, an image of said first opening illuminated by said illumination means at a position adjacent to a plane which is inclined with respect to the optical axis of said irradiating optical system, a second imaging optical system for forming, at a second magnification different from said first magnification, an image of said second opening illuminated by said illumination means at a position adjacent to said plane, and a third imaging optical system for projecting upon the surface being examined, the images of said first and second openings formed adjacent said plane, wherein said third imaging optical system is telecentric on its side facing the surface being examined.

16. An exposure apparatus, comprising:

a stage on which a wafer is to be placed;

directing means for directing an exposure beam to a first image plane, for exposure of the wafer to print a circuit pattern on the wafer;

an irradiating optical system for irradiating first and second portions of the wafer with first and second light beams, respectively, said irradiating optical system including a first limiting portion for limiting the first light beam so that the first light beam is projected to the first portion of the wafer and a second limiting portion for limiting the second light beam so that the second light beam is projected to the second portion of the wafer, wherein an image of the first limiting portion is formed on the first portion of the wafer while an image of the second limiting portion is formed on the second portion of the wafer;

a light receiving optical system having an optical axis inclined with respect to the wafer, for projecting upon a second image plane images of the first and second portions of the wafer, respectively, wherein said light receiving optical system comprises a common primary optical and an auxiliary optical arrangement disposed between the wafer and said second image plane, wherein said auxiliary optical arrangement comprises first and second auxiliary optical systems for receiving the first and second light beams respectively reflected from the first and second portions of the wafer, independently of each other while said primary optical system receives both the first and second light beams from the first and second portions of the wafer, and wherein a combined magnification of said primary optical system and said first auxiliary optical system, for the projection of the image of the first portion is substantially equal to that of said primary optical system and said second auxiliary optical system, for the projection of the image of the second portion;

detecting means for detecting positions of the images of the first and second light portions upon said second image plane; and adjusting means for adjusting a positional relation of the wafer with said first image plane so that the wafer is brought into substantial coincidence with said first image plane.

17. An apparatus according to claim 16, wherein said irradiating optical system is arranged such that the first and second light beams on the wafer being examined have substantially the same size.

18. An apparatus according to claim 17, wherein the exposure beam comprises an electron beam.

19. An apparatus according to claim 18, wherein said directing means focuses the electron beam upon said first image plane, to draw a circuit pattern with the electron beam.

20. An apparatus according to claim 17, wherein the exposure beam comprises deep ultraviolet light.

21. An apparatus according to claim 17, wherein the exposure beam comprises X-rays.

22. An apparatus according to claim 17, wherein said directing means comprises a reduction projection lens system for projecting an image of a predetermined circuit pattern upon said first image plane with the exposure beam.

23. An apparatus according to claim 17, wherein said light receiving optical system has an intermediate image plane which is correlated with the wafer being exposed, so as to satisfy a Scheimpflug's condition with respect to said primary optical system, wherein said primary optical system serves to image the first and second light portions upon said intermediate image plane, wherein said first auxiliary optical system serves to re-image the image of the first portion on said intermediate image plane, upon said second image plane, and wherein said second auxiliary optical system serves to re-image the image of the second portion on said intermediate image plane, upon said second image plane.

24. An apparatus according to claim 17, wherein said irradiating optical system is telecentric on its light emission side, and wherein said light receiving optical system is telecentric both on a light entrance side and on a light emission side.

25. An apparatus according to claim 17, wherein the first and second portions are at those positions which are different from each other with respect to a meridional direction of said light receiving optical system.

26. A projection exposure apparatus, comprising:
   a stage on which a wafer is to be placed;
   a projection optical system having a first image plane, for projecting upon said first image plane an image of a circuit pattern;
   an irradiating optical system having an optical axis inclined with respect to the wafer, for irradiating first and second portions of a zone of the wafer with first and second light beams, respectively, of substantially the same size, said irradiating optical system including a first limiting portion for limiting the first light beam so that the first light beam is projected to the first portion of the zone of the wafer and a second limiting portion for limiting the second light beam so that the second light beam is projected to the second portion of the zone of the wafer, wherein an image of the first limiting portion is formed on the first portion of the zone of the wafer while an image of the second limiting portion is formed on the second portion of the zone of the wafer;
   a light receiving optical system having an optical axis inclined with respect to the wafer, for projecting upon a second image plane images of the first and second portions of the wafer, respectively, wherein said light receiving optical system comprises a common primary optical and an auxiliary optical arrangement disposed between the wafer and said second image plane, wherein said auxiliary optical arrangement comprises first and second auxiliary optical systems for receiving the first and second light beams respectively reflected from the first and second portions of the wafer, independently of each other while said primary optical system receives both the first and second light beams from the first and second portions of the wafer, and wherein a combined magnification of said primary optical system and said first auxiliary optical system, for the projection of the image of the first portion, is substantially equal to that of said primary optical system and said second auxiliary optical system, for the projection of the image of the second portion;
   detecting means for detecting positions of the images of the first and second portions upon said second image plane; and
   adjusting means for adjusting a positional relation of the wafer with said first image plane so that the wafer in the zone is brought into substantial coincidence with said first image plane.

27. An apparatus according to claim 26, wherein the circuit pattern image is formed with an electron beam.

28. An apparatus according to claim 26, wherein the circuit pattern image is formed with deep ultraviolet light.

29. An apparatus according to claim 26, wherein the circuit pattern image is formed with X-rays.

30. An apparatus according to claim 26, wherein said irradiating optical system is telecentric on its light emission side, and wherein said light receiving optical system is telecentric both on a light entrance side and on a light emission side.

31. An apparatus according to claim 26, wherein the first and second portions are at positions which are different from each other with respect to a meridional direction of said light receiving optical system.

32. A device for detecting positions of first and second portions of a wafer with respect to a direction of a projection axis of an exposure optical system, said device comprising:
   an illumination optical system for illuminating the portions of the wafer, said illumination optical system including a first limiting portion for limiting light to be projected to the first portion of the wafer and a second limiting portion for limiting light to be projected to the second portion of the wafer, wherein an image of the first limiting portion is formed on the first portion of the wafer while an image of the second limiting portion is formed on the second portion of the wafer;
   an imaging optical system for imaging each portion of the wafer as each respective portion is illuminated by said illumination optical system, said imaging optical system comprising (i) a common optical system, having an optical axis inclined relative to the wafer, for receiving reflection beams from the portions of the wafer, and (ii) a plurality of correction optical systems for independently receiving reflection beams from the portions of the wafer, said imaging optical system having approximately even imaging magnifications with respect to the imaging of the portions of the wafer upon a predetermined plane through said common optical system and said correction optical systems; and
   means for detecting positions of images of the portions of the wafer upon the predetermined plane.

33. A device according to claim 32, wherein said illumination optical system has an optical axis inclined relative to the wafer, and optical axes of said illumination optical system and said imaging optical substantially intersect each other on the wafer.

34. A device according to claim 33, wherein said common optical system is disposed between the wafer and said correction optical systems, said plurality of correction optical systems are disposed in parallel to each other, and said common optical system projects images of the portions of the wafer upon a predetermined intermediate image plane by using reflected beams from the portions of the wafer, while said correction optical systems re-image the images of corresponding portions of the wafer, which are projected upon the predetermined intermediate image plane.

35. A device according to claim 34, wherein said illumination optical system illuminates the portions of the wafer with different radiation beams in substantially the same direction, and said common optical system of said imaging optical system comprises a dual-telecentric optical system that is telecentric both on the wafer side and the segmented correction optical system side.

36. A device according to claim 35, wherein the radiation beams illuminating the wafer have substantially the same size.

37. A device according to claim 36, wherein each of the radiation beams has different wavelengths.

38. A device according to claim 36, further comprising a radiation source for generating radiation energy, wherein said illumination optical system comprises (i) stop means having optical apertures irradiated with the radiation energy from said radiation source and (ii) a telecentric optical system, which is telecentric on the wafer side, for projecting images of said optical apertures upon corresponding portions of the wafer by using the radiation beams from said optical apertures.

39. An exposure apparatus for projecting an exposure beam upon a wafer through an exposure optical system to expose the wafer with the exposure beam, said apparatus comprising:
an illumination optical system for illuminating first and second portions of the wafer, said illumination optical system including a first limiting portion for limiting light to be projected to the first portion of the wafer and a second limiting portion for limiting light to be projected to the second portion of the wafer, wherein an image of the first limiting portion is formed on the first portion of the wafer while an image of the second limiting portion is formed on the second portion of the wafer;
an imaging optical system for imaging each portion of the wafer as each respective portion is illuminated by said illumination optical system, said imaging optical system comprising (i) a common optical system, having an optical axis inclined relative to the wafer, for receiving reflected beams from the portions of the wafer, and (ii) a plurality of correction optical systems for independently receiving reflection beams from the portions of the wafer, said imaging optical system having approximately even imaging magnifications with respect to the imaging of the portions of the wafer upon a predetermined plane through said common optical system and said correction optical systems;
position detecting means for detecting positions of images of the portions of the wafer upon the predetermined plane; and
means for adjusting the position of the wafer in the direction of a projection axis of the exposure optical system on the basis of the detection by said position detecting means.

40. An apparatus according to claim 39, wherein said illumination optical system has an optical axis inclined relative to the wafer, and optical axes of said illumination optical system and said imaging optical system substantially intersect each other on the wafer.

41. An apparatus according to claim 40, wherein said common optical system is disposed between the wafer and said correction optical systems, said plurality of correction optical systems are disposed in parallel to each other, and said common optical system projects images of the portions of the wafer upon a predetermined intermediate image plane by using reflection beams from the portions of the wafer, while said correction optical systems re-image the images of corresponding portions of the wafer, which are projected upon the predetermined intermediate image plane.

42. An apparatus according to claim 41, wherein said illumination optical system illuminates the portions of the wafer with different radiation beams in substantially the same direction, and said common optical system of said imaging optical system comprises a dual-telecentric optical system that is telecentric both on the wafer side and the correction optical system side.

43. An apparatus according to claim 42, wherein the radiation beams illuminating the wafer have substantially the same size.

44. An apparatus according to claim 43, wherein each of the radiation beams has different wavelengths.

45. An apparatus according to claim 43, further comprising a radiation source for generating radiation energy, wherein said illumination optical system comprises (i) stop means having optical apertures irradiated with the radiation energy from said radiation source and (ii) a telecentric optical system, which is telecentric on the wafer side, for projecting images of said optical apertures upon corresponding portions of the wafer by using the radiation beams from said optical apertures.

46. An exposure apparatus for focusing an exposure beam upon a wafer through an exposure optical system to expose the wafer with the exposure beam, said apparatus comprising:
an illumination optical system for illuminating first and second portions of the wafer, said illumination optical system including a first limiting portion for limiting light to be projected to the first portion of the wafer and a second limiting portion for limiting light to be projected to the second portion of the wafer, wherein an image of the first limiting portion is formed on the first portion of the wafer while an image of the second limiting portion is formed on the second portion of the wafer;
an imaging optical system for imaging each portion of the wafer as each respective portion is illuminated by said illumination optical system, said imaging optical system comprising (i) a common optical system, having an optical axis, inclined relative to the wafer, for receiving reflection beams from the portions of the wafer, and (ii) a plurality of correction optical systems for independently receiving reflection beams from the portions of the wafer, said imaging optical system having approximately even imaging magnifications with respect to the imaging of the portions of the wafer upon a predetermined plane through said common optical system and said correction optical systems;
position detecting means for detecting positions of images of the portions of the wafer upon said predetermined plane; and
means for adjusting the spacing between the wafer and a focal plane upon which the exposure beam is focused, on the basis of the detection by said position detecting means.

47. An apparatus according to claim 46, wherein said illumination optical system has an optical axis inclined relative to the wafer, and optical axes of said illumination optical system and said imaging optical system substantially intersect each other on the wafer.

48. An apparatus according to claim 47, wherein said common optical system is disposed between the wafer and said correction optical systems, said plurality of correction optical systems are disposed in parallel to each other, and said common optical system projects images of the portions of the wafer upon a predetermined intermediate image plane by using reflection beams from the portions of the wafer, while said correction optical systems re-image the images of corresponding portions of the wafer, which are projected upon the predetermined intermediate image plane.

49. An apparatus according to claim 48, wherein said illumination optical system illuminates the portions of the wafer with different radiation beams in substantially the same direction, and said common optical system of said imaging optical system comprises a dual-telecentric optical system that is telecentric both on the wafer side and the segmented correction optical system side.

50. An apparatus according to claim 49, wherein the radiation beams illuminating the wafer have substantially the same size.

51. An apparatus according to claim 50, wherein each of the radiation beams has different wavelengths.

52. An apparatus according to claim 50, further comprising a radiation source for generating radiation energy, wherein said illumination optical system comprises (i) stop means having optical apertures irradiated with the radiation energy from said radiation source and (ii) a telecentric optical system, which is telecentric on the wafer side, for projecting images of said optical apertures upon corresponding portions of the wafer by using the radiation beams from said optical apertures.

53. A surface position detecting device for detecting surface height at different portions of a surface being examined, said device comprising:

an irradiating optical system, having an optical axis inclined with respect to the surface, for irradiating first and second portions of the surface with first and second light beams, respectively, wherein said irradiating optical system comprises a first limiting portion for limiting the first light beam so that the first light beam is projected to the first portion of the surface and a second limiting portion for limiting the second light beam so that the second light beam is projected to the second portion of the surface, an image of the first limiting portion being formed on the first portion of the surface and an image of the second limiting portion being formed on the second portion of the surface and wherein the first and second light beams have substantially the same size upon the surface;

a light receiving optical system, having an optical axis inclined with respect to the surface, for projecting upon a predetermined image plane images of the first and second irradiated portions of the surface, respectively, wherein the first and second beams, respectively reflected from the first and second portions of the surface, have substantially the same size on the predetermined image plane; and position detecting means for detecting positions of the first and second beams upon the predetermined image plane.

54. A device according to claim 53, wherein the first and second portions of the surface are disposed in a direction extending along a plane including the optical axes of said irradiating optical system and said light receiving optical system.

55. An exposure apparatus for projecting an exposure beam upon a wafer, said apparatus comprising:

an irradiating optical system, having an optical axis inclined with respect to the wafer, for irradiating first and second portions of the wafer with first and second light beams, respectively, wherein said irradiating optical system comprises a first limiting portion for limiting the first light beam so that the first light beam is projected to the first portion of the wafer and a second limiting portion for limiting the second light beam so that the second light beam is projected to the second portion of the wafer, an image of the first limiting portion being formed on the first portion of the wafer and an image of the second limiting portion being formed on the second portion of the wafer and wherein the first and second light beams have substantially the same size upon the wafer;

a light receiving optical system, having an optical axis inclined with respect to the wafer, for projecting upon a predetermined image plane images of the first and second irradiated portions of the wafer, respectively, wherein the first and second beams, respectively reflected from the first and second portions of the wafer, have substantially the same size on the predetermined image plane; and position detecting means for detecting positions of the first and second beams upon the predetermined image plane; and means for adjusting the position of the wafer in the direction of a projection axis of the exposure optical system on the basis of the detection by said position detecting means.

56. An apparatus according to claim 55, wherein the first and second portions of the wafer are disposed in a direction extending along a plane including the optical axes of said irradiating optical system and said light receiving optical system.

* * * * *

UNITED STATES PATENT AND TRADEMARK OFFICE
CERTIFICATE OF CORRECTION

PATENT NO. : 5,414,515
DATED : May 9, 1995
INVENTOR(S) : Haruna KAWASHIMA

It is certified that error appears in the above-indentified patent and that said Letters Patent is hereby corrected as shown below:

COLUMN 8:

Line 52, "242.formed" should read --242 formed--.

COLUMN 15:

Line 60, "reflecting" should read --deflecting--.

COLUMN 16:

Line 59, "light," should read --light--.

COLUMN 19:

Line 20, "those" should be deleted.

UNITED STATES PATENT AND TRADEMARK OFFICE
CERTIFICATE OF CORRECTION

PATENT NO. : 5,414,515
DATED : May 9, 1995
INVENTOR(S) : Haruna KAWASHIMA

It is certified that error appears in the above-indentified patent and that said Letters Patent is hereby corrected as shown below:

COLUMN 20:

Line 54, "optical" (second occurrence) should read --optical system--.

COLUMN 21:

Line 5, "segmented" should be deleted.

COLUMN 23:

Line 13, "segmented" should be deleted.

Signed and Sealed this

Fifth Day of September, 1995

*Attest:*

BRUCE LEHMAN

*Attesting Officer*    *Commissioner of Patents and Trademarks*